United States Patent
Chen

(10) Patent No.: US 9,980,365 B1
(45) Date of Patent: May 22, 2018

(54) ELECTRONIC DEVICE

(71) Applicant: MSI COMPUTER (SHENZHEN) CO.,LTD., Shenzhen, Guangdong Province (CN)

(72) Inventor: Min-Lang Chen, New Taipei (TW)

(73) Assignee: MSI COMPUTER (SHENZHEN) CO., LTD., Shenzhen (CN)

( * ) Notice: Subject to any disclaimer, the term of this patent is extended or adjusted under 35 U.S.C. 154(b) by 0 days. days.

(21) Appl. No.: 15/426,031

(22) Filed: Feb. 6, 2017

(30) Foreign Application Priority Data

Dec. 27, 2016 (TW) .............................. 105219779 U

(51) Int. Cl.
- H05K 1/02 (2006.01)
- H05K 1/18 (2006.01)
- H05K 1/09 (2006.01)
- H05K 5/04 (2006.01)

(52) U.S. Cl.
CPC ............. H05K 1/0212 (2013.01); H05K 1/09 (2013.01); H05K 1/18 (2013.01); H05K 5/04 (2013.01); H05K 2201/10151 (2013.01)

(58) Field of Classification Search
None
See application file for complete search history.

(56) References Cited

U.S. PATENT DOCUMENTS

| | | | | |
|---|---|---|---|---|
| 4,899,256 A * | 2/1990 | Sway-Tin | ................. | F02P 3/02 361/715 |
| 4,908,696 A * | 3/1990 | Ishihara | ................ | H01L 23/345 257/713 |
| 5,268,558 A * | 12/1993 | Youssef | ................... | H05B 3/26 219/209 |
| 5,305,184 A * | 4/1994 | Andresen | ................ | H01L 23/44 165/104.33 |
| 5,305,185 A * | 4/1994 | Samarov | ............. | H01L 23/4006 165/185 |
| 5,459,352 A * | 10/1995 | Layton | ................ | H01L 23/3733 257/713 |
| 5,471,027 A * | 11/1995 | Call | ....................... | H01L 21/563 219/85.13 |
| 5,940,272 A * | 8/1999 | Emori | ................... | H02M 7/003 165/185 |
| 5,973,923 A * | 10/1999 | Jitaru | ....................... | H01F 27/06 165/185 |
| 6,114,674 A * | 9/2000 | Baugh | .................... | H01C 13/00 174/250 |
| 6,180,436 B1 * | 1/2001 | Koors | ................. | H01L 23/3675 257/E23.104 |
| 6,282,092 B1 * | 8/2001 | Okamoto | .............. | H01L 23/142 165/80.3 |
| 6,459,586 B1 * | 10/2002 | Miller | ................... | H01F 17/043 174/252 |
| 6,501,662 B2 * | 12/2002 | Ikeda | ..................... | H02M 7/003 174/252 |

(Continued)

Primary Examiner — Dimary Lopez Cruz
Assistant Examiner — Muhammed Azam
(74) Attorney, Agent, or Firm — Maschoff Brennan

(57) ABSTRACT

An electronic device comprises a metal casing, a circuit board and a heating assembly. The metal casing has a storage space. The circuit board is located in the storage space. The heating assembly comprises a first heating part and a second heating part. The first heating part is in thermal contact with the circuit board, and the second heating part is in thermal contact with the metal casing.

7 Claims, 3 Drawing Sheets

(56) References Cited

U.S. PATENT DOCUMENTS

| | | | | |
|---|---|---|---|---|
| 6,542,368 B2* | 4/2003 | Miyazawa | H01L 23/3675 | 165/185 |
| 6,853,071 B2* | 2/2005 | Yoshikawa | H01L 23/345 | 257/712 |
| 6,916,184 B2* | 7/2005 | Yamada | B60R 16/0238 | 174/50 |
| 7,038,910 B1* | 5/2006 | Hodge | H05K 7/20445 | 165/185 |
| 7,040,383 B2* | 5/2006 | Oyamada | H05K 5/068 | 165/104.21 |
| 7,161,804 B2* | 1/2007 | Oyamada | H05K 5/061 | 165/185 |
| 7,315,450 B2* | 1/2008 | Ishii | H01L 23/467 | 165/185 |
| 7,349,227 B2* | 3/2008 | Kashiwazaki | B60R 16/0239 | 174/50.52 |
| 7,417,861 B2* | 8/2008 | Kikuchi | H01L 25/162 | 257/E23.105 |
| 7,423,881 B2* | 9/2008 | Eibl | H05K 1/0203 | 165/185 |
| 7,474,185 B2* | 1/2009 | Hooey | H01F 27/266 | 336/55 |
| 7,518,862 B1* | 4/2009 | Macika | G06F 1/20 | 361/688 |
| 8,009,435 B2* | 8/2011 | Metzger | H05K 7/1429 | 361/704 |
| 8,125,785 B2* | 2/2012 | Nelson | H05K 7/20536 | 361/730 |
| 8,325,039 B2* | 12/2012 | Picard | E05B 9/02 | 340/542 |
| 8,373,990 B2* | 2/2013 | Jarmany | H05K 7/20445 | 174/526 |
| 8,421,217 B2* | 4/2013 | Casey | H01L 23/04 | 257/704 |
| 8,520,381 B2* | 8/2013 | Hobein | H02M 7/003 | 361/679.54 |
| 8,531,841 B2* | 9/2013 | Lee | H05K 7/209 | 174/252 |
| 8,670,243 B2* | 3/2014 | Mitsuhashi | H05K 1/117 | 361/679.32 |
| 8,797,742 B2* | 8/2014 | Kawai | H05K 7/20854 | 361/704 |
| 8,934,249 B2* | 1/2015 | Chen | H05K 7/20445 | 361/704 |
| 8,964,401 B2* | 2/2015 | Escamilla | H05K 5/065 | 174/260 |
| 2003/0198022 A1* | 10/2003 | Ye | H01L 23/36 | 361/719 |
| 2003/0227750 A1* | 12/2003 | Glovatsky | H05K 7/20454 | 361/699 |
| 2006/0098416 A1* | 5/2006 | Duarte | H05K 1/0206 | 361/752 |
| 2006/0171127 A1* | 8/2006 | Kadoya | B29C 45/14377 | 361/752 |
| 2007/0045801 A1* | 3/2007 | Sugiyama | H05K 1/0271 | 257/684 |
| 2008/0128895 A1* | 6/2008 | Oman | H01L 23/3675 | 257/712 |
| 2010/0046177 A1* | 2/2010 | Rapp | H05K 7/1434 | 361/752 |
| 2012/0300405 A1* | 11/2012 | Weeber | H01L 23/552 | 361/709 |
| 2013/0107461 A1* | 5/2013 | Jang | G06F 1/183 | 361/707 |
| 2017/0064812 A1* | 3/2017 | Baba | H05K 1/0213 | |

* cited by examiner

ELECTRONIC DEVICE

CROSS-REFERENCE TO RELATED APPLICATIONS

This non-provisional application claims priority under 35 U.S.C. § 119(a) on Patent Application No(s). 105219779 filed in Taiwan, R.O.C. on Dec. 27, 2016, the entire contents of which are hereby incorporated by reference.

TECHNICAL FIELD

The disclosure relates to an electronic device, more particularly a heating electronic device.

BACKGROUND

Generally, in a room temperature environment (such as 10° C. to 40° C.), heat generated by electronic devices is required to be removed. For example, in an electronic device with a fanless system, heat sources are directly in contact with a casing of the electronic device, such that heat generated by the heat sources is transferred to the surface of the casing, and then is dissipated to outside air via radiation and convection.

On the other hand, in a low temperature environment (such as −40° C.), electronic devices are required to be heated up before being turned on. If an electronic device is turned on at a low temperature, the electronic device may be damaged, and therefore its service life is shortened. Hence, when an electronic device is operated in a low temperature environment, the electronic components inside the electronic device should be heated up to a safe temperature (such as 0° C.) before the electronic device is turned on in order to protect the electronic components and extend the service life of the electronic device.

SUMMARY

One embodiment of the disclosure provides an electronic device comprising a metal casing, a circuit board and a heating assembly. The metal casing has a storage space. The circuit board is located in the storage space. The heating assembly comprises a first heating part and a second heating part. The first heating part is in thermal contact with the circuit board, and the second heating part is in thermal contact with the metal casing.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
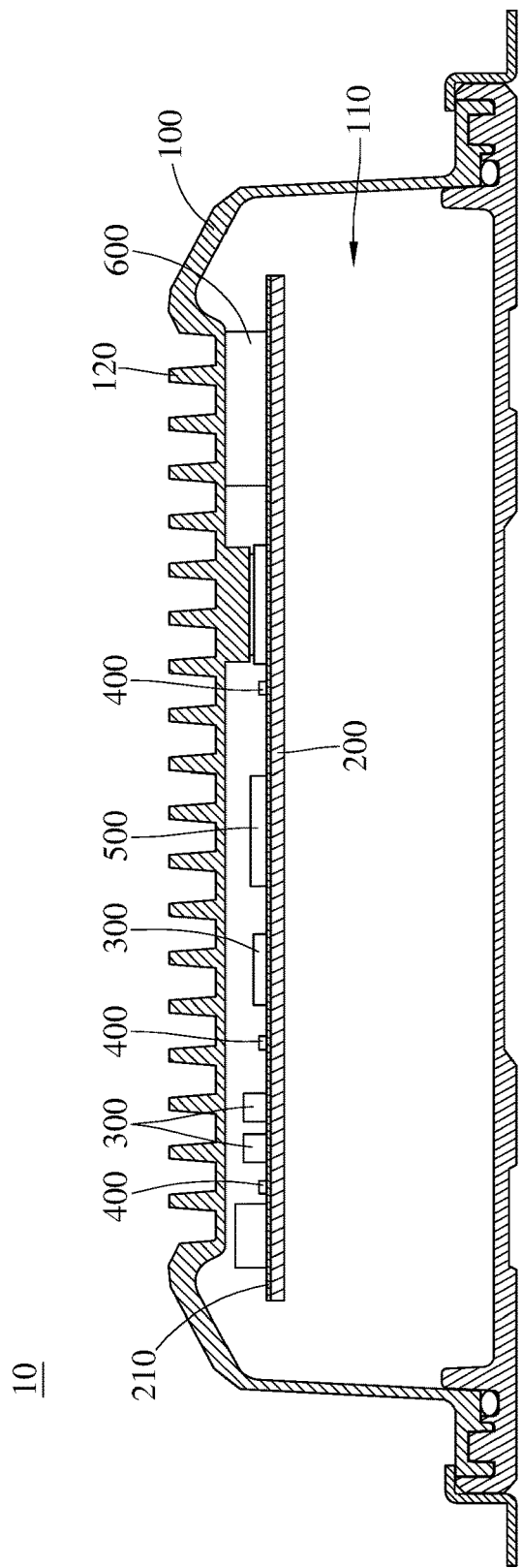
FIG. 1 is a cross-sectional view of an electronic device in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
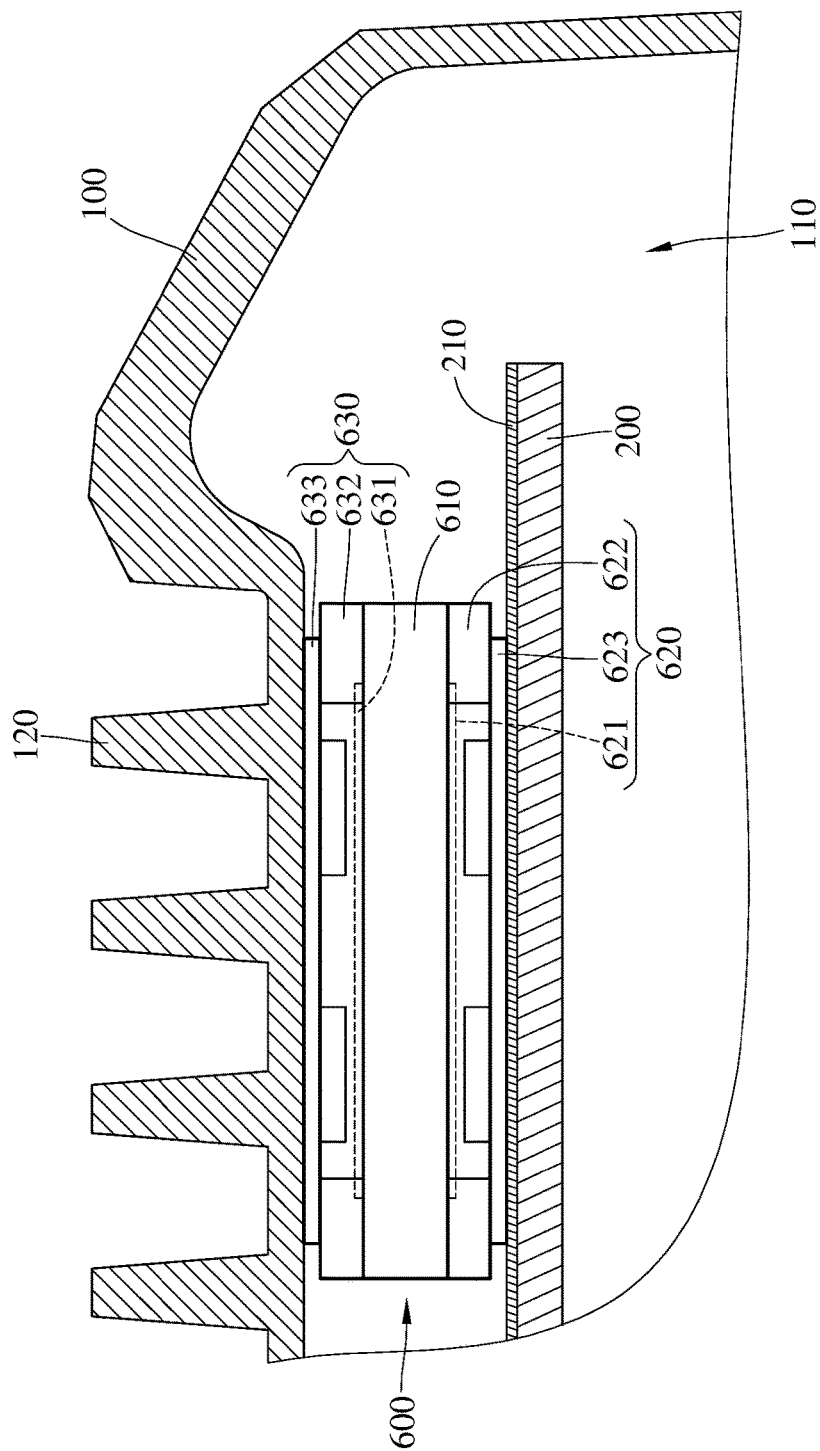
FIG. 2 is a partial enlarged view of FIG. 1.
Figure 3:
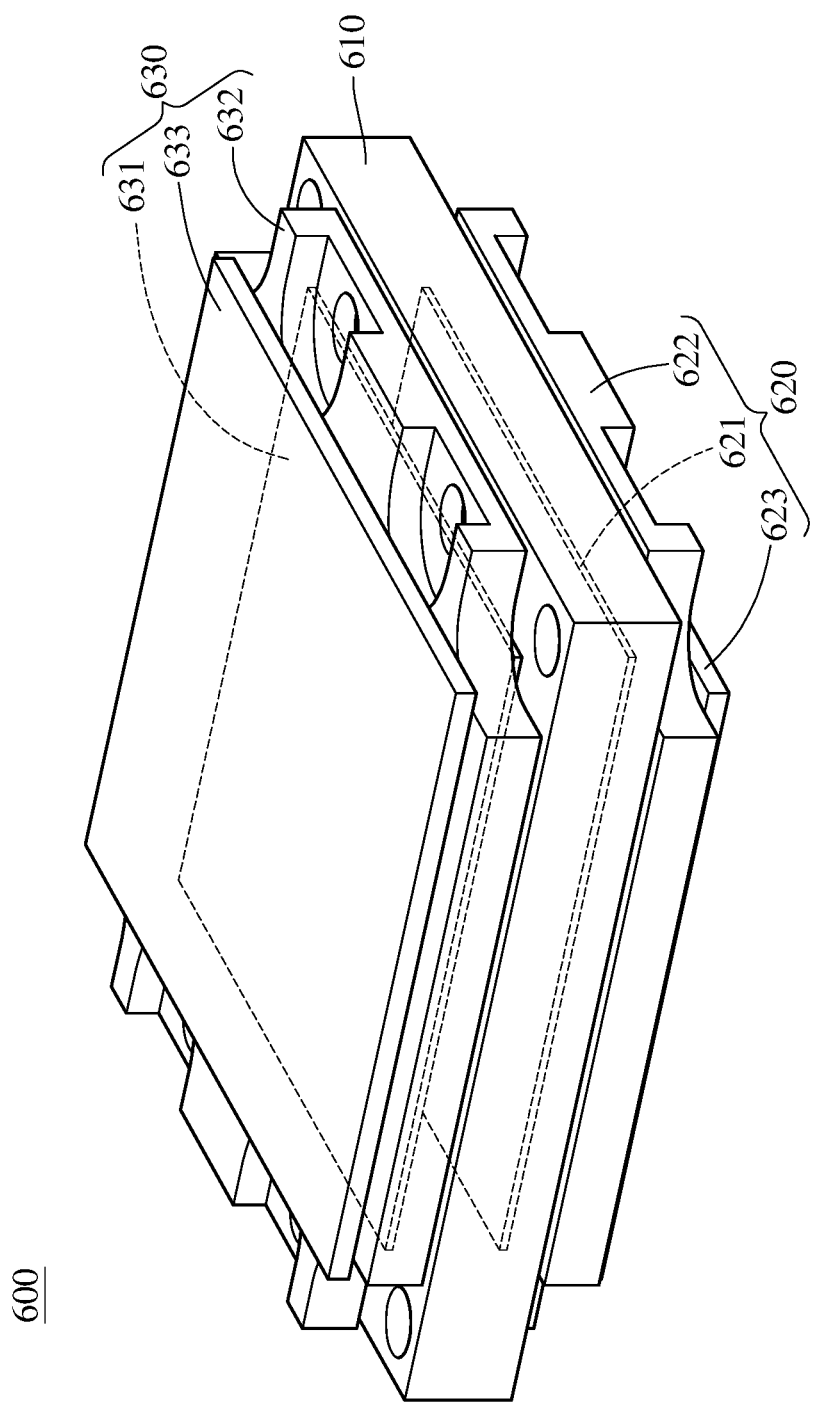
FIG. 3 is a perspective view of a heating assembly in FIG. 1.

Please refer to FIG. 1 to FIG. 3. FIG. 1 is a cross-sectional view of an electronic device in accordance with one embodiment of the disclosure. FIG. 2 is a partial enlarged view of FIG. 1. FIG. 3 is a perspective view of a heating assembly in FIG. 1.

In this embodiment, an electronic device 10 includes a metal casing 100, a circuit board 200, a plurality of electronic components 300, a plurality of temperature sensors 400, a controller 500 and a heating assembly 600.

The metal casing 100 has a storage space 110. In addition, the metal casing 100 has a plurality of fins 120 on a side of the metal casing 100 facing away from the storage space 110, but the disclosure is not limited thereto. In other embodiments, the metal casing may have no fins.

The circuit board 200 is located in the storage space 110. The circuit board 200 has an electrically conductive layer 210. The electrically conductive layer 210 is, for example, a copper foil.

The electronic components 300 are, for example, a graphics processing unit (GPU) chip, a power adapter, a south bridge chip or a north bridge chip. The electronic components 300 are connected to the electrically conductive layer 210.

The temperature sensors 400 are respectively close to each of the electronic components 300. The temperature sensors 400 are configured for detecting the temperature of the electronic components 300.

The heating assembly 600 includes a base part 610, a first heating part 620 and a second heating part 630. The first heating part 620 includes a first heating sheet 621, a first aluminum block 622 and a first thermally conductive sheet 623. The first aluminum block 622 is stacked on one side of the base part 610. The first heating sheet 621 is embedded in one side of the first aluminum block 622 close to the base part 610. The first thermally conductive sheet 623 is stacked on one side of the first aluminum block 622 away from the base part 610, and the first thermally conductive sheet 623 is in thermal contact with electrically conductive layer 210 of the circuit board 200. The second heating part 630 includes a second heating sheet 631, a second aluminum block 632 and a second thermally conductive sheet 633. The second aluminum block 632 is stacked on one side of the base part 610 opposite to the first aluminum block 622. The second heating sheet 631 is embedded in one side of the second aluminum block 632 close to the base part 610. The second thermally conductive sheet 633 is stacked on one side of the second aluminum block 632 away from the base part 610, and the second thermally conductive sheet 633 is in thermal contact with the metal casing 100.

The controller 500 is, for example, a processor. The controller 500 is electrically connected to the temperature sensors 400. The controller 500 is configured for receiving sensor signals from the temperature sensors 400, and turning on/off the heating assembly 600 according to the sensor signals. In detail, in a low temperature environment (such as −40° C.), the electronic components 300 are required to be heated up to a safe temperature (such as 0° C.) before the electronic device 10 is turned on in order to extend the service life of the electronic components 300. Therefore, if one of the temperature sensors 400 detects the temperature of one of the electronic component 300 lower than a lowest optimal temperature for turning on the electronic device 10, the first heating sheet 621 will be activated by the controller 500 in order to generate heat. The heat generated by the first heating sheet 621 is transferred to the electrically conductive layer 210 of the circuit board 200 through the first aluminum block 622 and the first thermally conductive sheet 623, so that the heat generated by the first heating sheet 621 is transferred to each electronic component 300, and makes the temperatures of all the electronic components 300 to reach an optimal temperature for turning on the electronic device 10, for example, more than 0° C. When the temperature sensors 400 detect that the temperatures of all the electronic components 300 are in an optimal temperature range for turning on the electronic device 10, the controller 500 turns on the electronic device 10. In addition, after the electronic device 10 is turned on, the controller 500 immediately cuts off the power supplied to the first heating sheet 621 in order to stop generating heat. However, if the temperature sensors 400 detect that the temperatures of the electronic components 300 drop to a temperature lower than the lowest optimal temperature for turning on the electronic device 10, the first heating sheet 621 will be activated by the controller 500 in order to generate heat to maintain the temperature of the electronic device 10 to be suitable for the electronic device 10 to be turned on.

In addition, in this embodiment, if one of the temperature sensors 400 detects the temperature of one of the electronic components 300 is lower than the optimal temperature for turning on the electronic device 10, the second heating sheet 631 will be activated by the controller 500 as well in order to generate heat, and the heat generated by the second heating sheet 631 is transferred to the metal casing 100 through the second aluminum block 632 and the second thermally conductive sheet 633. Therefore, heat is transferred to the electronic components 300 from two directions so as to accelerate heat-up of the electronic components 300 for the temperature of the electronic components 300 to reach the optimal temperature, for example, more than 0° C.

Moreover, when the ambient temperature is low and the electronic device 10 has a requirement for system maintenance or needs to be repaired, the electronic device 10 is required to be turned off and sent to a room temperature environment (such as 25° C.). However, since the massive change in the ambient temperature, liquid water or frost occurs while water vapor condenses on the surface of the metal casing 100. Therefore, once the electronic device 10 is moved from a low temperature environment to a room temperature environment, the electronic device 10 can't be repaired immediately, it should be left for around 2 to 3 hours until the frost or liquid water thereon is evaporated in order to prevent the frost or liquid water from accidentally in contact with the electronic components 300 to result in damage. Therefore, when the electronic device 10 is moved to a room temperature environment from a low temperature environment, the second heating sheet 631 is activated by the controller 500 in order to heat up the metal casing 100. As a result, the frost and liquid water on the surface of the metal casing 100 is evaporated due to the heat, such that the time waiting for the evaporation of the frost and liquid water is shortened.

According to the electronic device as described above, the heating assembly is able to transfer heat through two directions. One of the directions is transferring toward the electrically conductive layer of the circuit board, and the other one is transferring toward the metal casing. The heating assembly is optional to transfer heat through both directions, only one of the directions, or be turned off, which is favorable for heating up the electronic components and removing the frost and liquid water on the surface of the metal casing more efficient.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:
1. An electronic device, comprising:
a metal casing having a storage space;
a circuit board located in the storage space; and
a heating assembly comprising a base part, a first heating part and a second heating part, the first heating part and the second heating part being respectively disposed on two sides of the base part opposite to each other;
wherein the first heating part comprises a first heating sheet, a first aluminum block and a first thermally conductive sheet; the first aluminum block is stacked on one side of the base part; the first heating sheet is embedded in one side of the first aluminum block close to the base part; the first thermally conductive sheet is stacked on one side of the first aluminum block away from the base part; the first thermally conductive sheet is in thermal contact with the circuit board; the second heating part comprises a second heating sheet, a second aluminum block and a second thermally conductive sheet; the second aluminum block is stacked on one side of the base part opposite to the first aluminum block; the second heating sheet is embedded in one side of the second aluminum block close to the base part; the second thermally conductive sheet is stacked on one side of the second aluminum block away from the base part; and the second thermally conductive sheet is in thermal contact with the metal casing.

2. The electronic device according to claim 1, wherein the circuit board has an electrically conductive layer, the first thermally conductive sheet is in thermal contact with the electrically conductive layer.

3. The electronic device according to claim 2, wherein the electrically conductive layer is made of copper.

4. The electronic device according to claim 2, further comprising at least one electronic component, and the at least one electronic component connected to the electrically conductive layer.

5. The electronic device according to claim 4, further comprising at least one temperature sensor and a controller, the at least one temperature sensor close to the at least one electronic component, the at least one temperature sensor configured for detecting the temperature of the at least one electronic component, the controller configured for receiving a sensor signal from the at least one temperature sensor, and turning on/off the heating assembly according to the sensor signal.

6. The electronic device according to claim 5, wherein the quantity of the at least one electronic component and the quantity of the at least one temperature sensor are both plural, and the temperature sensors are respectively close to the electronic components.

7. The electronic device according to claim 1, wherein the metal casing has a plurality of fins.

* * * * *